United States Patent [19]

Ladd, Jr. et al.

[11] 4,160,984
[45] Jul. 10, 1979

[54] SCHOTTKY-GATE FIELD-EFFECT TRANSISTOR AND FABRICATION PROCESS THEREFOR

[75] Inventors: Glenn O. Ladd, Jr., Rancho Palos Verdes; Frederick W. Cleary, Westlake Village, both of Calif.

[73] Assignee: Hughes Aircraft Company, Culver City, Calif.

[21] Appl. No.: 851,224

[22] Filed: Nov. 14, 1977

[51] Int. Cl.² ............................................. H01L 29/80
[52] U.S. Cl. ......................................... 357/22; 357/15; 357/55; 357/68; 357/91
[58] Field of Search ....................... 357/55, 22, 91, 15, 357/68

[56] References Cited

U.S. PATENT DOCUMENTS

| | | | |
|---|---|---|---|
| 3,700,978 | 10/1972 | North et al. | 357/91 |
| 3,912,546 | 10/1975 | Aunsperger et al. | 357/91 |
| 4,015,278 | 3/1977 | Fukuta | 357/55 |

*Primary Examiner*—Edward J. Wojciechowicz
*Attorney, Agent, or Firm*—W. J. Bethurum; W. H. MacAllister

[57] ABSTRACT

The specification describes a Schottky-gate field-effect transistor and related fabrication process wherein thin ion implanted surface stabilization regions are formed between source and gate electrodes and gate and drain electrodes of the device and to a thickness of between 100 and 1,000 angstroms. This is accomplished utilizing the source, gate and drain electrodes as an ion implantation mask against impinging inert ions which render the implanted regions semi-insulating, and this process requires no post-implantation annealing.

3 Claims, 6 Drawing Figures

SCHOTTKY-GATE FIELD-EFFECT TRANSISTOR AND FABRICATION PROCESS THEREFOR

FIELD OF THE INVENTION

This invention relates generally to new and improved Schottky-gate field-effect transistors and a semiconductor fabrication process therefor. More particularly, the invention relates to such field-effect devices fabricated utilizing improved self-aligning ion implantation masking techniques to form devices with improved electrical stablility and an optimimized RF performance.

BACKGROUND

Schottky-gate field-effect transistors are generally well known in the art and have been described, for example, by Robert G. Hunsperger et al in U.S. Pat. No. 3,912,546, assigned to the present assignee, and by James C. North et al in U.S. Pat. No. 3,700,978, assigned to the Bell Telephone Laboratories. These field-effect devices have been fabricated in both silicon and gallium arsenide and have also been referred to by the acronym, MESFET, which stands for Metal-Semiconductor Field-Effect Transistor. As a result of recent advances in the GaAs FET art which have improved the high frequency performance of these microwave devices, they have been the subject of many recent in-depth publications, such as an article by S. V. Bearse in the February, 1976 issue of MICROWAVES and entitled "Gallium Arsenide Field-Effect Transistors: Device Designers Solving Reliability Problems", at page 32 et seq. These GaAs FET devices are also described by K. Sekido et al in the April–May, 1976 issue of the M.S.N. Journal in an article entitled "Recent Advances in FET Device Performance and Reliability", at page 71 et seq. The above and other references to be identified are incorporated herein by reference.

These Schottky-gate microwave devices typically include, among other things, spaced apart source, gate and drain electrodes on the surface of an epitaxial gallium arsenide layer, with the source and drain electrodes making ohmic contact to the epitaxial gallium arsenide layer and the gate electrode making Schottky contact between the source and drain electrodes to thereby define the channel region of the device. The source and drain electrodes will typically be of a gold germanium alloy material suitable for making good ohmic contact to the GaAs, whereas aluminium is a preferred metal for use as the Schottky-gate contact for the device. The Schottky-gate electrode is adapted to receive a control or modulating gate voltage, $V_g$, for modulating the channel conductivity and this controls the flow of current between the source and drain electrodes of the device.

In the fabrication of these gallium arsenide field-effect transistors, it has been one practice to leave the upper surface of the epitaxial gallium arsenide layer completely exposed to environmental surroundings. However, it has been observed that such an unprotected and unpassivated gallium arsenide epitaxial layer will exhibit undesirable surface states in response to applied electric fields. These surface states cause the time drift of various electrical parameters of the device under constant voltage bias conditions, and such drift is described in more detail in an article by J. S. Barrera entitled "GaAs Field Effect Transistors", *Microwave Journal*, Vol. 19, No. 2, February 1976. The origin of this time drift is the change of occupancy of carrier trapping centers under the influence of applied electric fields. These traps or trapping centers are located either near or at the surface of the FET device, or in the body of its conducting channel, or at the interface between the device channel and its underlying substrate. These deleterious surface and trapping effects are also described in some detail in the above-identified MSN Journal article by K. Sekido et al.

Previous attempts to reduce these undesirable device surface states have included the deposition of either (1) a layer of polycrystalline gallium arsenide (PGA) or (2) a layer of glass (such as amorphous silicon dioxide or a silicate glass) on the exposed surface of the semiconductor layer upon which the source, gate and drain electrodes are located. The deposition of polycrystalline gallium arsenide for purposes of device surface stabilization is described, for example, by D. R. Chen et al in article entitled "Long Term Stabilization of Microwave FET's", *Microwave Journal*, at pages 80–81. The utilization of silicon dioxide for these same surface stabilization purposes is described in the above-identified MSN Journal article by K. Sekido et al.

One disadvantage of utilizing either of the above surface-insulator approaches to device stabilization involves the difficulty in controlling and precisely reproducing these surface insulator layers in batch fabrication processes. Additionally, both of these prior art surface insulating layer deposition processes introduce certain chemical impurities into the deposited insulating layers, and this in turn creates further surface instability problems for the devices being fabricated. Furthermore, when polycrystalline gallium arsenide is deposited over the entire surface of a field-effect transistor, the desired high resistivity of the PGA layer depends upon the proper reaction of the polycrystalline gallium arsenide with the residual atmosphere in the PGA vacuum deposition system utilized. Additionally, PGA layer deposition has been known to accelerate failure of the FET electrode metallization used as a result of the increased reaction between the PGA surface insulator and the electrode metals in direct contact therewith.

THE INVENTION

The general purpose of this invention is to provide a new and improved Schottky-gate field-effect transistor and fabrication process therefor which avoids or eliminates most, if not all, of the above disadvantages of these prior art device stabilization processes, and simultaneously produces a GaAs FET device with improved electrical stability and RF performance characteristics. It is a more specific purpose of this invention to achieve the above device features utilizing an inert ion implantation process which produces a minimum of adverse side effects on other critical FET device parameters, such as source-to-gate and gate-to-drain resistance and parasitic drain-to-gate feedback capacitance.

To accomplish the above purposes, we have discovered and developed a process for fabricating a surface stabilized Schottky-gate field-effect transistor which comprises initially depositing spaced apart source, gate and drain electrodes on the surface of a selected GaAs semiconductor crystal. Thereafter, chosen inert ions, such as xenon ions, are implanted into very thin surface regions of the crystal which are exposed by openings between the source, gate and drain electrodes. Such inert ion implantation forms lattice damaged and electrically compensated surface stabilizing regions which extend between 100 and 1,000 angstroms beneath the surface of the crystal, and these implanted semi-insulating regions minimize the affects of carrier traps and defects at the semiconductor crystal surface on device performance and thus minimize drift, device time constants and noise in the ultimate FET device.

Accordingly, it is an object of the present invention to provide a new and improved Schottky-gate field-effect transistor and fabrication process therefor.

Another object is to provide a Schottky-gate field-effect device of the type described having improved electrical stability and reduced electric field drift, device time constants and noise.

Another object of this invention is to provide a new and improved process of the type described which is useful for reducing the affects of surface states and other crystal defects on the noise and gain properties of the ultimate FET device. The semi-insulating region produced by inert ion implantation at the device surface substantially reduces current flow into these surface states and also brings the Fermi level of the semiconductor crystal below the energy level of the more shallow lying states in the forbidden gap of the GaAs material. This characteristic reduces the fluctuation of charge in these surface states and therefore reduces the fluctuation in current through the FET channel, the latter being a source of noise in the drain or output current of the device.

A further object of this invention is to provide an FET device of the type described having an improved and maximized gain resulting from a minimized parasitic gate-to-drain feedback capacitance.

A feature of this invention is the provision of a Schottky-gate FET fabrication process of the type described wherein the source, gate and drain electrodes of the device are multi-functional in the sense that they also provide self-aligned masking for inert ion implantation into a thin surface region or regions of the device.

Another feature of this invention is the provision of a GaAs FET fabrication process of the type described which can be precisely controlled by controlling the ion dose and continuously monitoring the affects of the ion implantation on the implanted FET structure to form the surface stabilized regions therein.

Another feature of this invention is the provision of a transistor fabrication process of the type described which can be precisely reproduced and controlled in impurity content by means of the inert ion selection process involved. These inert ions form no new undesired defects or complexes within the implanted material, and no post-implantation annealing is required.

These and other objects and features of this invention will become more readily apparent in the following description of the accompanying drawing.

DETAILED DESCRIPTION OF THE DRAWINGS

Figure 1:
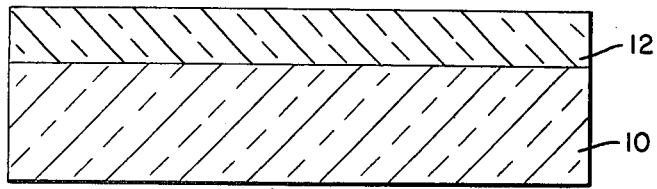
FIG. 1 is a schematic cross-section view of a gallium arsenide substrate and epitaxial layer starting material for the process to be described.

Referring now to FIG. 1, there is shown a gallium arsenide substrate 10 which will typically be 8 to 10 mils in thickness, and will have a bulk resistivity of about $10^8$ ohm·cm. The substrate 10 has an epitaxial layer 12 of gallium arsenide thereon which is typically 0.1–1.0 micrometers in thickness and has a bulk resistivity of approximately 0.1 ohm·centimeters.

Figure 2:
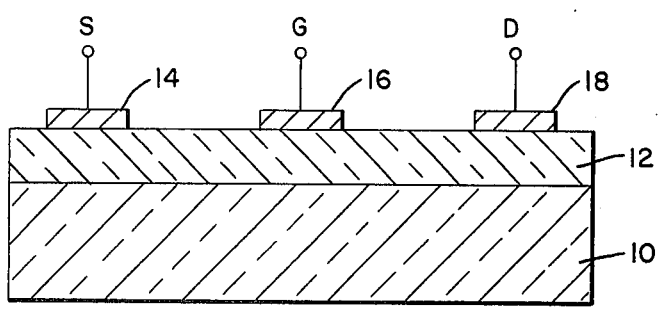
FIG. 2 illustrates the formation of source, gate and drain electrodes on the structure of FIG. 1.

The epitaxial layer 12 may be deposited on the substrate 10 using known vapor phase epitaxial (VPE) or liquid phase epitaxial (LPE) processes, and one such LPE process is described, for example, in U.S. Pat. No. 3,994,755 issued to G. S. Kamath et al and assigned to the present assignee. After a selected epitaxial deposition process is used in the fabrication of the epitaxial structure of FIG. 1, such structure is transferred to a conventional ohmic contact deposition station where the source and drain electrodes 14 and 18 are deposited on the surface of the epitaxial layer 12 as shown in FIG. 2. The source and drain electrodes 14 and 18 are deposited separately from and prior to the deposition of the gate electrode 16 and are subsequently annealed at a chosen anneal temperature, usually between 400° C. to 500° C. The source and drain electrodes 14 and 18 are typically of a gold-germanium alloy which makes a good ohmic contact to the epitaxial layer 12 after annealing. The Schottky gate metallization for the gate electrode 16 is preferably aluminum, and is deposited, for example, using vacuum evaporation subsequent to the annealing of the source and drain electrodes as described above.

Figure 3:
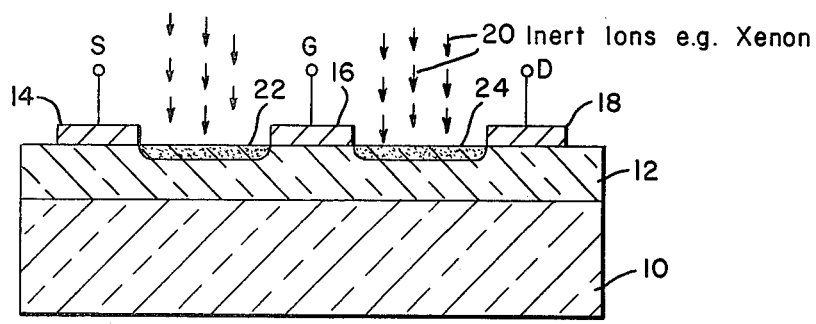
FIG. 3 illustrates schematically the implantation of inert ions into the structure of FIG. 2 to form the surface stabilized regions therein between source, gate and drain electrodes of the device.

The structure of FIG. 2 is transferred to a suitable ion implantation chamber (not shown) where it is exposed to a beam 20 of preselected inert ions, and these ions are accelerated into the exposed surface regions of the GaAs epitaxial layer 12 and between source and gate and gate and drain electrodes thereof. These implanted inert ions form thin surface damaged regions 22 and 24 which extend from between 100 and a 1000 angstroms beneath the upper surface of the epitaxial layer 12. Thus, the source, gate and drain electrodes 14, 16 and 18 function as the inert ion implantation mask to define and limit the lateral extent of the thin ion damaged surface stabilization regions 22 and 24 as shown in FIG. 3. These surface stabilized regions 22 and 24, which are semi-insulating and have a resistivity in the range of $10^4$–$10^8$ ohm·centimeters, serve to minimize device drift, time constants and noise in the operation of the ultimate gallium arsenide field-effect devices of the types shown in FIGS. 3 and 4.

Figure 4:
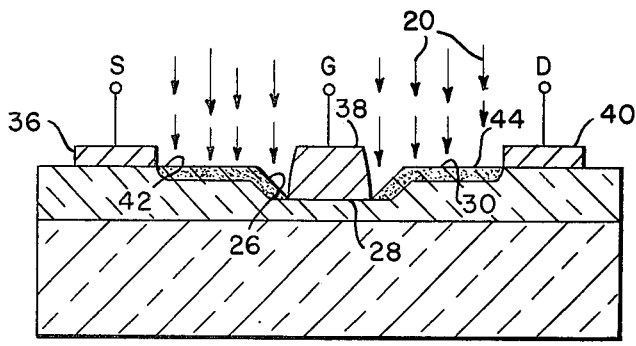
FIG. 4 illustrates schematically an alternative embodiment of the invention wherein the device epitaxial layer and channel region thereof are contoured in the inverted mesa geometry shown using known and documented photoresist and etching procedures prior to the inert ion implantation step of the process.

The gallium arsenide field-effect transistor shown in FIG. 4 represents an alternative embodiment of the present invention wherein known and documented photoresist and preferential etching techniques are utilized initially on the epitaxial structure of FIG. 1 in order to provide the trapezoidial shaped, contoured surface areas 26, 28 and 30 in the device epitaxial layer. This contour has the effect of decreasing the threshold or turn on voltage for the ultimate GaAs FET device, a characteristic preferred for certain known amplifier and switching applications. These photoresist and preferential etching techniques are described in detail in copending application Ser. No. 640,124 of Glenn O. Ladd, assigned to the present assignee, and are incorporated herein by reference. Using these photoresist and preferential etching techniques, the vertical thickness (height) of the device channel region between the surface 28 upon which the gate electrode is deposited and the epitaxial layer-substrate interface 32 may be carefully controlled.

In accordance with this alternative process embodiment of the invention illustrated in FIG. 4, inert ions 34 are implanted in thin surface regions of the device between source, gate, and drain electrodes 36, 38 and 40 to thereby form the thin surface stabilized and ion damaged regions 42 and 44 of the FET. Therefore, it will be understood and appreciated that the geometry of the epitaxial layer 12 may be varied in accordance with this or other known channel-geometry control processes without departing from the scope of the present invention.

Figure 5A:
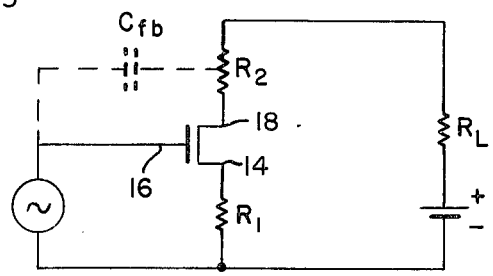
FIG. 5a illustrates schematically an equivalent electrical circuit which includes a device according to the invention interconnected to a source of RF input signals and also to an output load. The circuit parameters of source and drain resistance and drain-to-gate feedback capacitance therein are described in more detail below.

Referring now to FIG. 5a, it is to be noted that the present process has little if any affect on the source and drain resistances R1 and R2, respectively, for the GaAs FET. This feature results from the fact that the thin surface implanted regions 22, 24 and 42, 44 are on the order of 1,000 angstroms or less and therefore represent a negligible change in volume of GaAs crystal between the source, gate and drain electrodes which define a portion of R1 and R2. (The remainder of R1 and R2 results from the small metal-semiconductor contact resistance of the annealed source and drain electrodes 14 and 18 on the epitaxial layer 12.) Therefore, these ion implanted regions 22 and 24 represent a very small percentage of the total cross-sectional area through which source-to-drain current flows in the epitaxial layer 12. Since the GaAs crystal portion of the source and drain resistances is inversely proportional to this cross-sectional area through which source-to-drain current flows, then the provision of these ion implanted regions 22 and 24 produces only a small increase in R1 and R2 defined above.

The parasitic drain-to-gate feedback capacitance $C_{fb}$ (FIG. 5a) of these GaAs FET devices is minimized as result of the reduced carrier density in the ion implanted regions 22, 24 and 42, 44 in FIGS. 3 and 4, respectively, relative to the carrier density in the epitaxial layer 12. By reducing the extent of the free carrier depletion region between gate and drain electrodes, which is a natural result of the metal-semiconductor energy barrier formed by the gate electrode on the semiconductor, the capacitance $C_{fb}$ of FIG. 5a is decreased and the overall power gain is increased. The resulting reduced conductance between gate and drain electrodes 16 and 18 does not degrade device gain to a first order since such conductance is much greater than the drain conductance associated with the intrinsic, active, pinched-off channel in the vicinity of the gate electrode of GaAs FETs made by the present process.

Various inert ion species may be used in the above-identified ion implantation steps, and these include elements such as xenon, argon, helium, krypton and also protons. When implanting xenon into the virtually bare GaAs surface, for example, an ion dosage of between $10^{11}$ and $10^{13}$ ions per square centimeter may be used in combination with a chosen accelerating voltage of between 5 KeV and 50 KeV in order to produce suitable semi-insulating regions 22, 24 and 42, 44 of between $10^4$ and $10^8$ ohm-centimeters and approximately 100 to 1,000 angstroms in thickness. However, the selection of process parameters such as ion dosages, ion acceleration voltages, implantation times, and the like which are suitable to provide a desired implant thickness and resistivity are within the skill of the art and may be found in standard text materials such as *Projected Range Statistics: Semiconductors and Related Materials*, J. F. Gibbons, et al, Published by Dowden, Hutchinson & Ross, Stroudsberg, Pa., 2nd Ed., 1975.

Various other process modifications (and resultant device-geometry variations) may be made in the above-described embodiments without departing from the scope of this invention. For example, in one GaAs FET which we have actually built and successfully tested, we deposited a silicon dioxide layer (not shown) on the upper surface of the epitaxial structure of FIG. 2 by suitably exposing the epitaxial structure to the oxidation of silane, $SiH_4$, at about 320° C. This step provided a thin surface layer of $SiO_2$ having a measured thickness of about 400 Å. Subsequently, zenon was implanted through the thin $SiO_2$ layer at 120 KeV while half of the sample wafer was shielded from the ions by a metal shield.

Figure 5B:
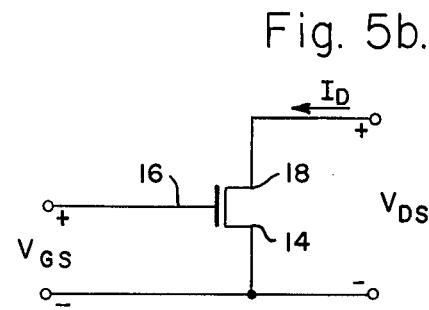
FIG. 5b illustrates the voltages applied to one of the GaAs FETs made using the present process and during the testing thereof to be described.

These devices were then tested in the circuit of FIG. 5b, where a drain voltage, $V_{DS}$, of 4 volts was applied as shown between the source and drain terminals and applied simultaneously with a gate voltage, $V_{GS}$, to the device. Then the time variation of drain current, $I_D$, was simultaneously measured with the variation of noise figure and gain at an operating frequency of 10 GHz. The arrangement and construction of the single stage amplifier circuit of FIG. 5b is well known to those versed in the art. For FETs with oxide layers but no inert ions implanted therein, we observed a decrease of noise figure by about 0.2 db, and an increase of gain by about 0.3 db, with the total variation occuring in a period of less than ten (10) minutes. After ten (10) minutes, the noise figure, associated power gain, and drain current, $I_D$, were continuously observed for a period of up to 24 hours, and no further variations in these parameters were observed. FETs from the same sample wafer with both oxide passivation and surface xenon implants showed a reduced variation in these parameters, which included 0.05 db variation in noise figure and 0.2 db variation in associated gain, with the total variation occuring in less than 2 minutes.

Measurements were also made on unoxidized, but xenon implanted devices of the type described above and then compared in similar tests to some of the unoxidized but unimplanted devices from the same wafer. For the unimplanted devices, measurements showed temporal variations in drain current up to 10% of the initial value, in noise figure up to 0.5 db, and in associated gain of up to 1 db. The total variations occured in about 15 minutes. The FETs from the same wafer which were implanted with xenon at 20 KeV and to a dose of $6 \times 10^{11}$ ions per square centimeter showed a reduced total variation in drain current ($I_D$) of about 2-3%, a variation (decrease) in noise figure of about 0.2 db, a variation (increase) of gain of about 0.3 db and a reduction in the total time required for the variations to cease to less than 5 minutes, and in some cases the total time required for variations to cease was less than 3 minutes.

What is claimed is:

1. A Schottky-gate field-effect transistor which comprises a III-V compound semiconductor crystal having spaced apart source, gate and drain electrodes thereof defining active current path regions of said device and further including thin inert ion implanted and lattice damaged high resistivity or semi-insulating regions extending only between and laterally coextensive with the spacing between said gate and source and said gate and drain electrodes, respectively, of said device and into said crystal to a depth of 1,000 angstroms or less to thereby minimize device drift, time constants and noise.

2. The device defined in claim 1 wherein said semiconductor crystal includes a substrate with an epitaxial semiconductor layer thereon, with the surface of said epitaxial semiconductor layer between said source and drain electrodes being contoured in a trapezoidial inverted mesa configuration wherein a horizontal mesa surface thereof supports said gate electrode in close proximity to an epitaxial layer-substrate interface of said device, and said inert ion implanted regions extend over the contoured sides of said inverted mesa configuration and only between said source and gate and gate and drain electrodes.

3. The device defined in claim 1 wherein the bulk resistivity of said ion implanted regions is in the range of $10^4-10^8$ ohm-centimeters, and said ion implanted regions represent less than 50 precent of the total thickness of the gallium arsenide epitaxial layer in which they are located.

* * * * *